United States Patent
Abdelhafiz et al.

(10) Patent No.: US 9,160,280 B1
(45) Date of Patent: Oct. 13, 2015

(54) MEMORY POLYNOMIAL BASED DIGITAL PREDISTORTER

(71) Applicant: KING FAHD UNIVERSITY OF PETROLEUM AND MINERALS, Dharhan (SA)

(72) Inventors: Abubaker Hassan Abdelhafiz, Alberta (CA); Oualid Hammi, Dhahran (SA); Azzedine Zerguine, Dhahran (SA); Ali Taleb Al-Awami, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 14/284,362

(22) Filed: May 21, 2014

(51) Int. Cl.
*H03F 1/32* (2006.01)
*H03F 3/21* (2006.01)

(52) U.S. Cl.
CPC .............. *H03F 1/3258* (2013.01); *H03F 3/21* (2013.01); *H03F 2200/129* (2013.01); *H03F 2201/3209* (2013.01)

(58) Field of Classification Search
USPC .................................. 375/296, 297; 455/561
See application file for complete search history.

(56) References Cited

U.S. PATENT DOCUMENTS

| | | | |
|---|---|---|---|
| 7,542,518 B2 | 6/2009 | Kim et al. | |
| 7,944,295 B2 | 5/2011 | Hongo et al. | |
| 8,421,534 B2 | 4/2013 | Kim et al. | |
| 8,558,615 B2 | 10/2013 | Li et al. | |
| 2005/0195919 A1* | 9/2005 | Cova | 375/297 |
| 2014/0254716 A1* | 9/2014 | Zhou et al. | 375/296 |
| 2014/0294119 A1* | 10/2014 | Sochacki | 375/296 |
| 2015/0061773 A1* | 3/2015 | Shi et al. | 330/291 |
| 2015/0080054 A1* | 3/2015 | Kim et al. | 455/561 |

FOREIGN PATENT DOCUMENTS

CN 101789920 A 7/2010

OTHER PUBLICATIONS

Garro et al., "Nonlinear Distortion Cancellation using Particle Swarm Optimization (PSO) based Predistortion in OFDM systems," Mobile and Wireless Communications Summit, Jul. 1-5, 2007, pp. 1-5 (abstract only).
Abubaker Hassan Abdelhafiz, Oualid Hammi, Azzedine Zerguine, Ali Taleb Al-Awami, Fadhel M. Ghannouchi, "A PSO Based Memory Polynomial Predistorter with Embedded Dimension Estimation", Oct. 21, 2013.

* cited by examiner

*Primary Examiner* — Eva Puente
(74) *Attorney, Agent, or Firm* — Richard C. Litman

(57) ABSTRACT

The memory polynomial based digital predistorter utilizes a cluster-based particle swarm optimization (PSO) technique and has an embedded model-size estimator. The PSO technique and model-size estimator efficiently find the dimensions and accurately estimate the coefficients of the memory polynomial based digital predistorter for improved linearity of a power amplifier.

8 Claims, 16 Drawing Sheets

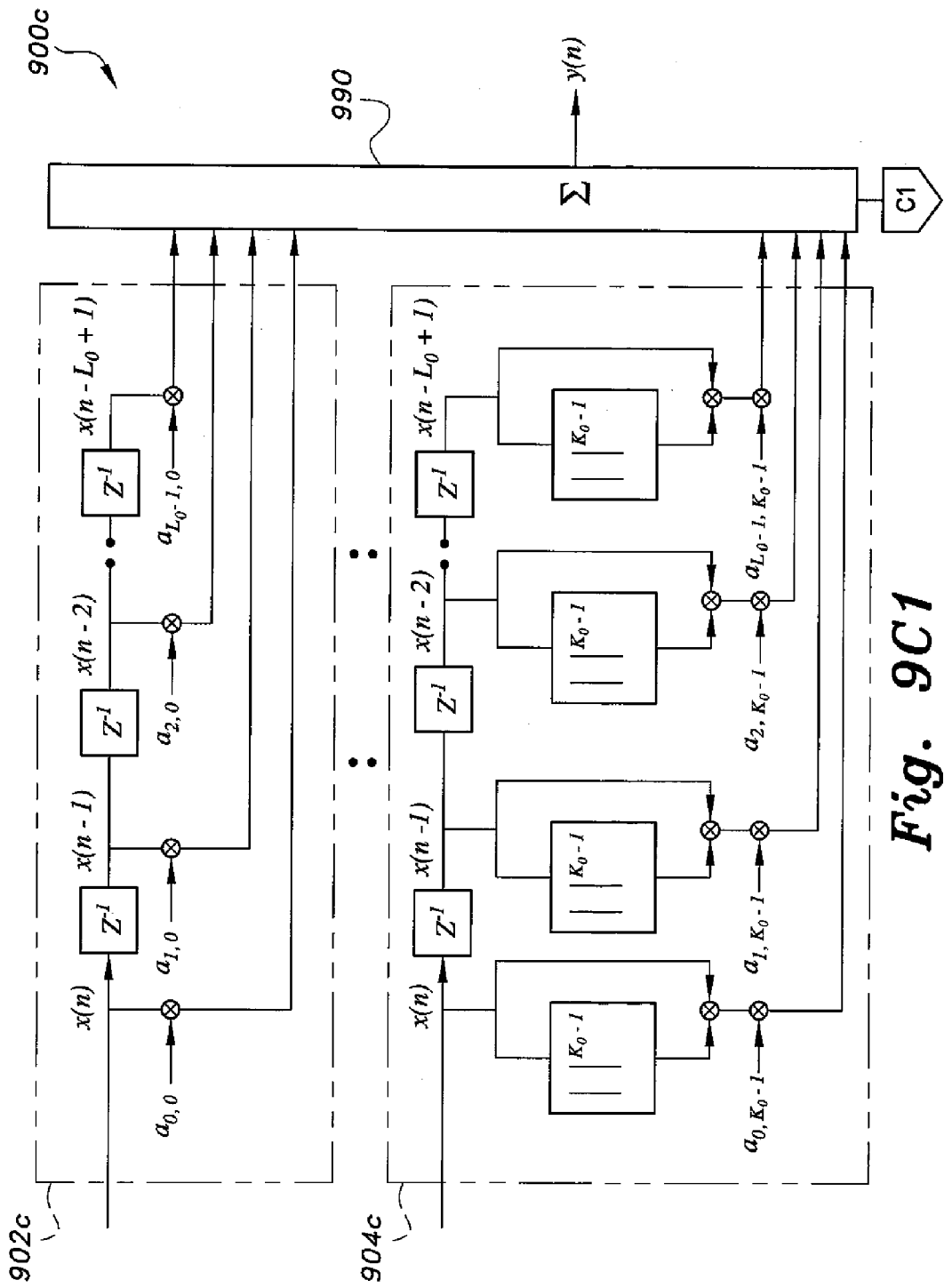
Fig. 9C1

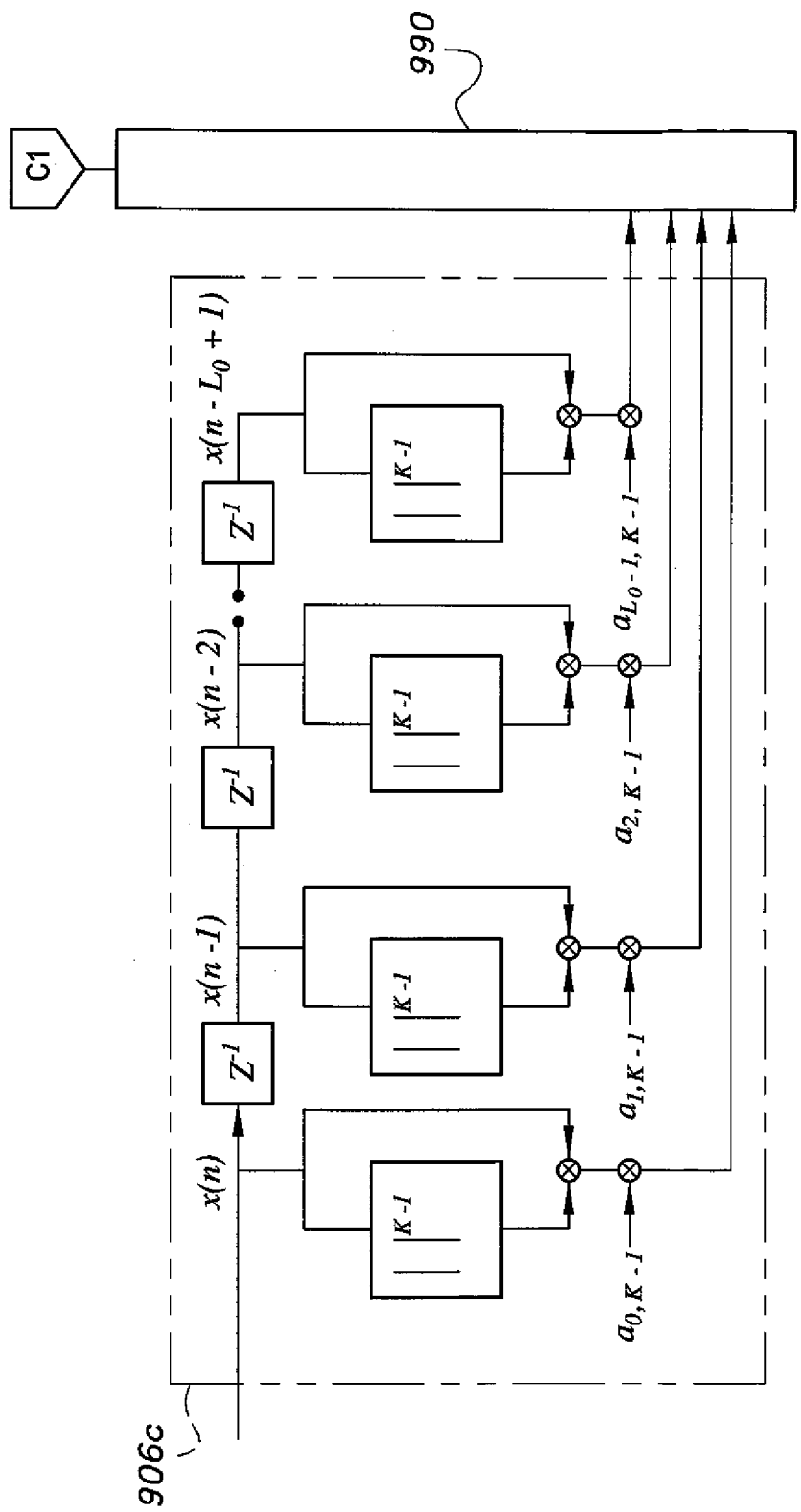
Fig. 9C2

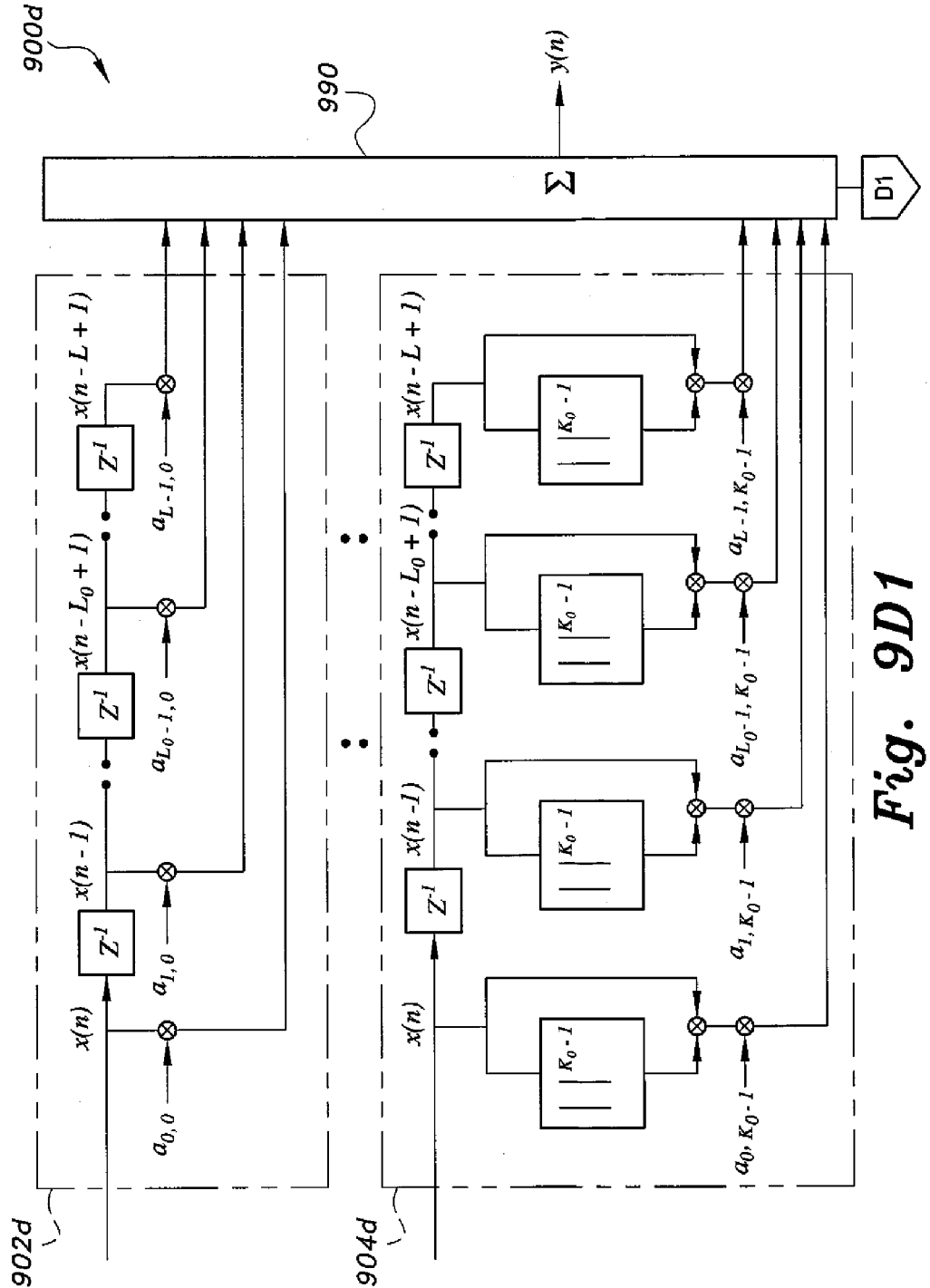
Fig. 9D1

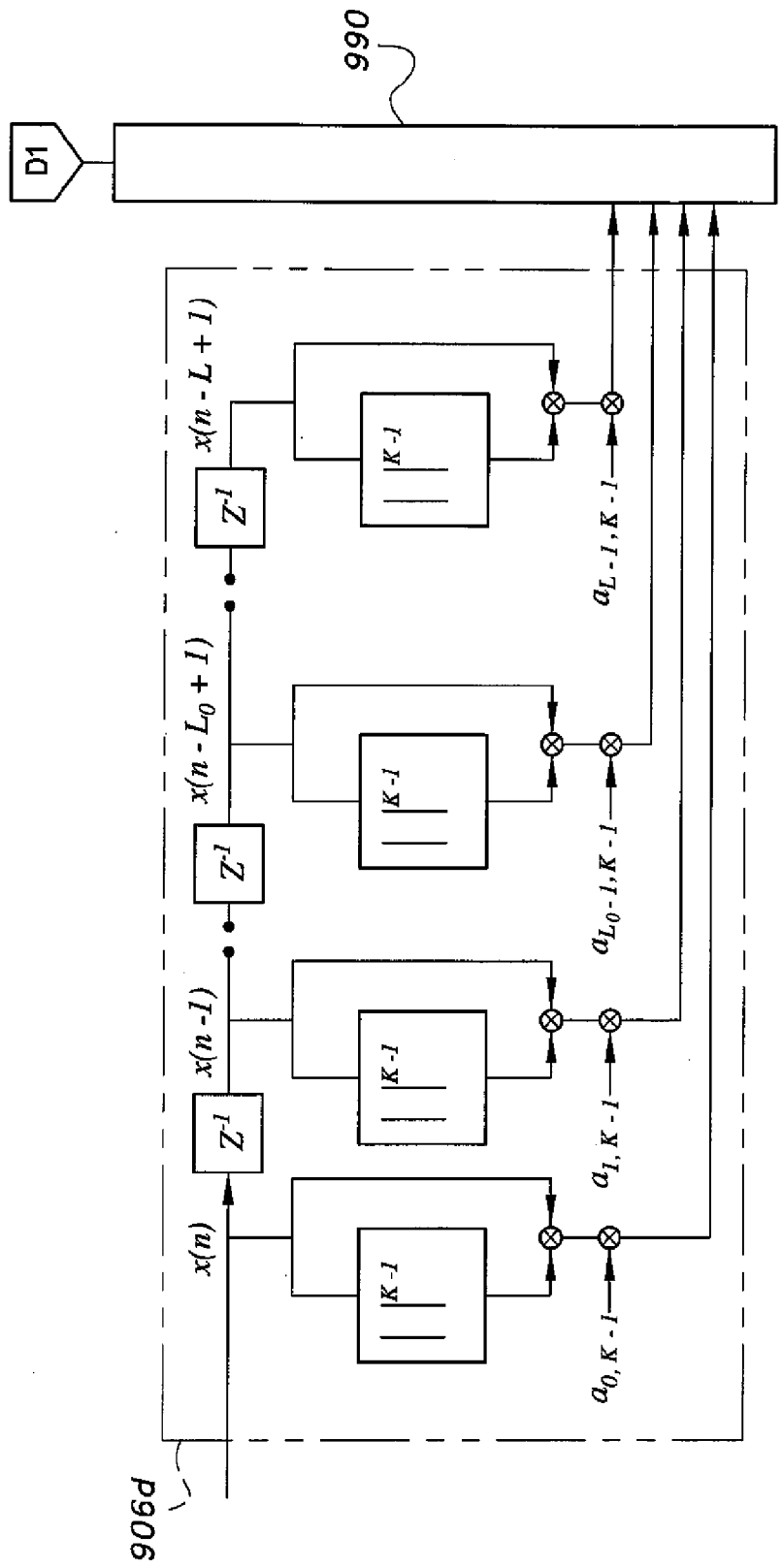
Fig. 9D2

MEMORY POLYNOMIAL BASED DIGITAL PREDISTORTER

BACKGROUND OF THE INVENTION

1. Field of the Invention

The present invention relates to telecommunication systems, and particularly to a memory polynomial (MP) based digital predistorter having PSO-based parameter extraction and model size estimation.

2. Description of the Related Art

Power amplifiers are widely used in RF broadcasting applications. However, they tend to exhibit nonlinear behavior which distorts the input signals both in the time and frequency domains, consequently motivating the development of techniques, such as digital predistortion, which can counteract this behavior. Among the challenges facing the identification of an amplifier's digital predistorter and behavioral model is finding the correct model dimensions; as this requires a priori knowledge of multiple parameters.

Thus, a memory polynomial based digital predistorter solving the aforementioned problems is desired.

SUMMARY OF THE INVENTION

The memory polynomial based digital predistorter utilizes a cluster-based particle swarm optimization (PSO) technique and has an embedded model-size estimator. The PSO technique and model-size estimator efficiently find the dimensions and accurately estimates the coefficients of the memory polynomial based digital predistorter.

These and other features of the present invention will become readily apparent upon further review of the following specification and drawings.

BRIEF DESCRIPTION OF THE DRAWINGS

FIG. 9C1-9C2 is a block diagram showing implementation of the PSO DPD for over-sized K according to the present invention.

FIG. 9D1-9D2 is a block diagram showing implementation of the PSO DPD for over-sized L and K according to the present invention.

FIG. 1013 is a block diagram showing input-processing-output of the proposed PSO DPD for over-sized L according to the present invention.

Similar reference characters denote corresponding features consistently throughout the attached drawings.

DETAILED DESCRIPTION OF THE PREFERRED EMBODIMENTS

Figure 1A:
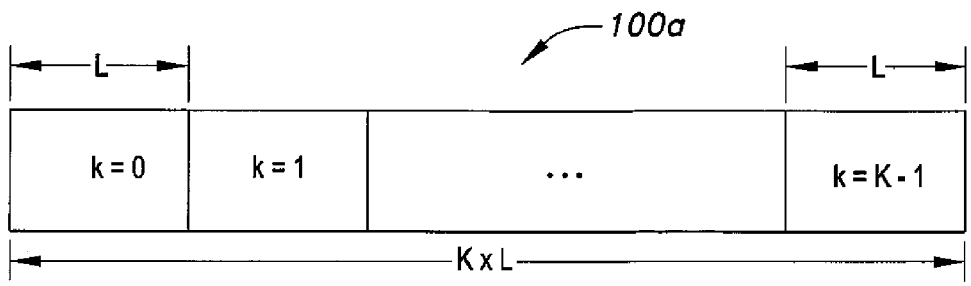
FIG. 1A is a pictorial diagram of a correctly sized DPD model.
Figure 1B:
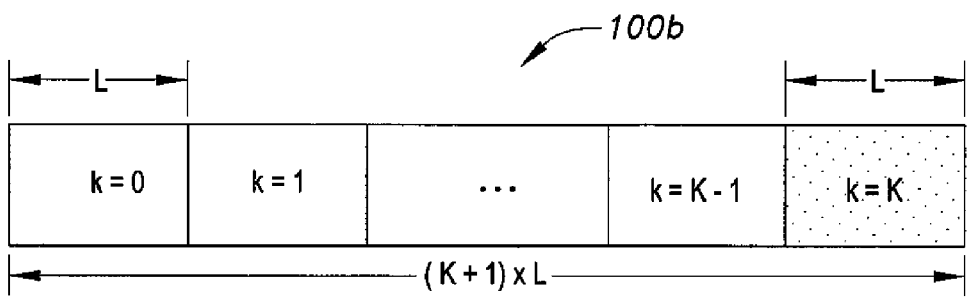
FIG. 1B is a pictorial diagram where K is over-sized in the DPD model.
Figure 1C:
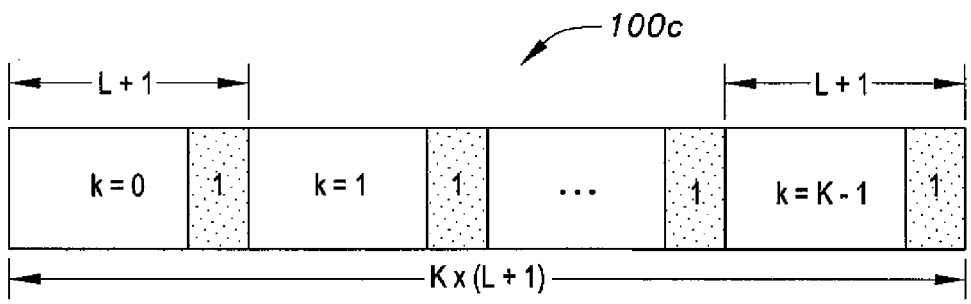
FIG. 1C is a pictorial diagram where L is over-sized in the DPD model.
Figure 1D:
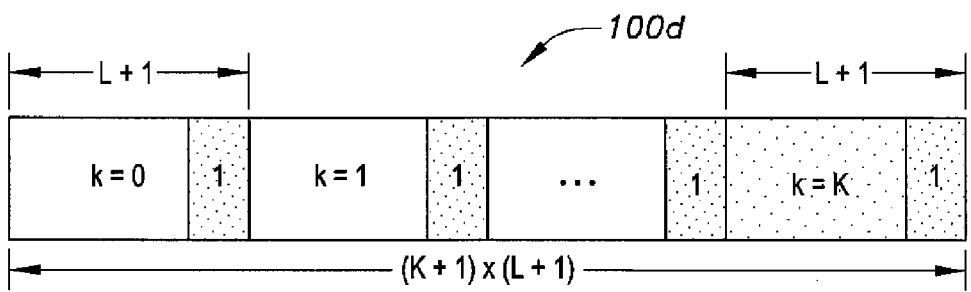
FIG. 1D is a pictorial diagram where both L and K are over-sized in the DPD model.

At the outset, it should be understood by one of ordinary skill in the art that embodiments of the present method can comprise software or firmware code executing on a computer, a microcontroller, a microprocessor, or a DSP processor; state machines implemented in application specific or programmable logic; or numerous other forms without departing from the spirit and scope of the method described herein. The present method can be provided as a computer program, which includes a non-transitory machine-readable medium having stored thereon instructions that can be used to program a computer (or other electronic devices) to perform a process according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

The memory polynomial based digital predistorter utilizes a cluster-based particle swarm optimization (PSO) technique and has an embedded model-size estimator. The PSO technique and model-size estimator efficiently find the dimensions and accurately estimates the coefficients of the memory polynomial based digital predistorter. Memory polynomial (MP) predistorters are commonly adopted for the linearization of power amplifiers. However, the identification of such predistortion function using adaptive algorithms suffers from several limitations mainly due to the correlated structure of the memory polynomial function.

PSO is a multi-agent optimization technique which was proposed by Eberhart and Kennedy in 1995. It has recently become viable as a result of the developments in the field of parallel processing. The reported results on the use of PSO techniques in power amplifiers modeling and linearization applications illustrate the potential benefits of using PSO techniques in identifying digital predistortion functions. The present invention utilizes a modified cluster-based PSO algorithm having a cost function based on the zero-norm. This method is applied to identify widely used memory polynomial based predistorters. The zero-norm enforces sparsity in estimation problems. The present method beneficially uses the zero-norm to minimize the number of coefficients in the predistortion function without affecting its performance.

The present technique is validated using measured data of a Doherty power amplifier prototype. Furthermore, the PSO algorithm is augmented with an embedded model size estimation capability that enables accurate estimation of the memory polynomial size (including nonlinearity order and memory depth). In practice, information about the appropriate size of the model to use is often not available to a designer who only has access to measured input-output signal waveforms. To deal with this issue, the disclosed variant of the PSO algorithm estimates the size as well as the coefficients of a memory polynomial based digital predistorter (DPD) when the size of the MP function is over-estimated initially.

The memory polynomial (MP) model is a simplified version of the Volterra series model obtained through taking only the diagonal terms of the Volterra series into account. A typical MP model consists of a double-summation over two parameters; the memory length L and the nonlinearity order K, which account for the model's flexibility. The expression for the output of the MP model is given by, $$y(n) = \sum_{k=0}^{K-1} \sum_{l=0}^{L-1} w_{l,k} x(n-l)|x(n-l)|^k \quad (1)$$

where the signals x(n) and y(n) are the complex baseband input and output waveforms, respectively, and $w_{l,k}$ represents the model's coefficients. L is the memory length parameter representing the amplifier's memory effects and K is the order of the amplifier's nonlinearity. By rearranging the terms, the output of a PA/DPD modeled with the MP model can be written in vector form as $$y(n) = u(n)w \quad (2)$$

where, $$w = [w_{0,0} \ldots w_{L-1,0} \ldots w_{0,K-1} \ldots w_{L-1,K-1}]^T \quad (3)$$

$$u(n) = [u_0 \ldots u_{K-1}] \quad (4)$$

and each of the component vectors $u_l$ is given by $$u_k = [x(n)|x(n)|^k \ldots x(n-l)|x(n-l)|^k] \quad (5)$$

where $0 \leq l \leq L-1$.

While the MP model is accurate, it requires that the designer has a priori knowledge of both of the model's dimensions parameters, namely L and K, in order to accurately formulate the identification problem. Given only a PA and a pair of input/output waveforms, the MP model's size is commonly empirically determined through sweeping the parameters and running the identification experiment until an (L, K) pair with adequate performance is found. Such approach can be a cumbersome procedure that is difficult to implement in real-time. Alternatively, over-sizing the model by picking parameter values larger than those actually needed is a common occurrence in order to guarantee satisfactory performance. Obviously, under-sizing the MP function will result in sub-optimal DPD performance. However, constructing a DPD using more coefficients than necessary, will increase the computational complexity associated with its implementation. Thus, it is important to be able to effectively determine the dimensions of memory polynomial based digital predistorters.

To illustrate the effects of over-sizing the model dimensions, the various possible scenarios are displayed in FIGS. 1A-1D. These figures shows that when K is over-sized, a block of L contiguous 'extra' entries is appended to the tail of the coefficients' vector, whereas over-sizing L adds K entries in a periodic fashion. This particular structure is adopted by the proposed particle swarm optimization based technique to extract the correct size of the model by searching for the coefficients in a structured manner (see 100a through 100d of FIGS. 1A through 1D for the possible MP scenario models).

The particle swarm optimization (PSO) algorithm was first developed by Kennedy and Eberhart. PSO utilizes a group, commonly called swarm, of agents, known as particles, that cooperate with one another and share information to achieve a certain goal, similar to how a school of fish would coordinate its movements to find food or evade a threat.

The basic version of PSO progresses in two stages: initialization and computation. In PSO, each particle has a position $P_i$ which is updated at each iteration step n by adding the particle's current position to its velocity term $V_i$. The definition of $V_i$ depends on the algorithm in use. Each position vector represents a possible solution and an implementation of PSO can be thought of as having a group of optimizers scan a vector space to find the best solution. The following provides a brief description of PSO's two stages of operation:

In the initialization stage, each particle is assigned a random starting position $P_i(0)$ within the boundaries of the problem space as defined by the user. Similarly, each particle is assigned an initial velocity, $V_i(0)$, that lies within the velocity boundaries. These are expressed in Equations (6) and (7), respectively. Usually, the velocity boundary is taken to be half that of the position.

$$P_i(0) \in [P_{min}, P_{max}] \quad (6)$$

$$V_i(0) \in [V_{min}, V_{max}] \quad (7)$$

where $P_{min}$ and $P_{max}$ are, respectively, the minimum and maximum bounds of the particle positions defined by the search space. Similarly, $V_{min}$ and $V_{max}$ are the boundaries on the velocity. It should be noted that since the signals and models involved are complex-valued, the positions and velocities of the particles are complex as well and thus, the real and imaginary parts of the particle's positions are bounded separately. The boundaries are chosen to be relatively large, with a uniform boundary equal to 1.5 times the maximum value the coefficients can take in both directions. This is to ensure that the search space is fully covered. After randomly initializing the locations of the particles, a fitness, also referred to as objective, function is evaluated for each particle using the normalized mean squared error (NMSE), defined as:

$$J_i(n) = 10\log_{10}\left(\frac{1}{N}\sum_{n=1}^{N}\frac{\|e(n)\|^2}{\|d(n)\|^2}\right) \quad (8)$$

where d(n) is the desired output signal used to evaluate the accuracy of the estimation, e(n) is the difference between the estimated output signal and the desired one, and N is the number of samples used for the training block. The above cost function is evaluated for each particle at every iteration and its value is used to determine which particle has the best position. This best position, denoted as the global best, is then stored in the global best vector as Gbest(0). Finally, the position reached by each particle by the end of the initialization process is designated as the particle's "local best". The local best of the $i^{th}$ particle at the end of the initialization stage is saved in its local best vector as $Pbest_i(0)$.

In the iterative computation stage, the position of each particle is updated according to the following recursion:

$$P_i(n) = P_i(n-1) + V_i(n) \quad (9)$$

where the velocity of the $i^{th}$ particle, $V_i$, is determined by:

$$V_i(n) = \omega(n) \cdot V_i(n-1) + b \cdot (\text{Pbest}_i(n) - P_i(n)) + c \cdot (\text{Gbest}(n) - P_i(n)) \quad (10)$$

The variables involved in equation (10) include the inertial weight $\omega(n)$, the cognitive coefficient b, and the social acceleration constant c. The inertia weight $\omega(n)$ is usually assigned values that decrease with the passage of time. This facilitates fast exploration of the solution space initially and more steady convergence later on. This has been shown to reduce the number of iterations required for successful convergence. The nature of the parameter's declining relationship with time can be either linear or nonlinear. In this work, the inertia weight was made to decline in a linear according to the following equation, $$\omega(n) = 0.1 \cdot \left( \omega(n-1) + \frac{\omega(n-1) - \omega_{min}}{n - m} \right) \quad (11)$$

where n is the index of the current iteration, and m is the total number of iterations.

The cognitive coefficient b determines how much influence a particle's best position is allowed to have on updating the particle's new position.

The social acceleration constant c is a parameter that fulfills the same role as b but for the global best estimate. Both c and b can be chosen to be random variables between 0 and 1 or can be scaled using such random variables. Alternatively, the acceleration constants can be allowed to vary with time, usually in a decreasing trend.

The performance of the PSO algorithm depends on the values chosen for its parameters, a sensitivity analysis must be conducted initially to choose the best parameters by sweeping the parameters. Following the update of the position of each particle at the $n^{th}$ iteration, the next step in the PSO computational stage is the evaluation of each particle's fitness function, using the cost function defined in equation (8), to determine whether the particle's current position ($\text{Pbest}_i(n)$) results in a better fit than its previously recorded best ($\text{Pbest}_i(n-1)$). Based on the result of this test, the particle's best position at the $n^{th}$ iteration is updated according to $$\begin{cases} J_i(n) < J_i(n-1) & \Rightarrow \quad \text{Pbest}_i(n) = P_i(n) \\ J_i(n) \geq J_i(n-1) & \Rightarrow \quad \text{Pbest}_i(n) = \text{Pbest}_i(n-1) \end{cases} \quad (12)$$

Figure 2:
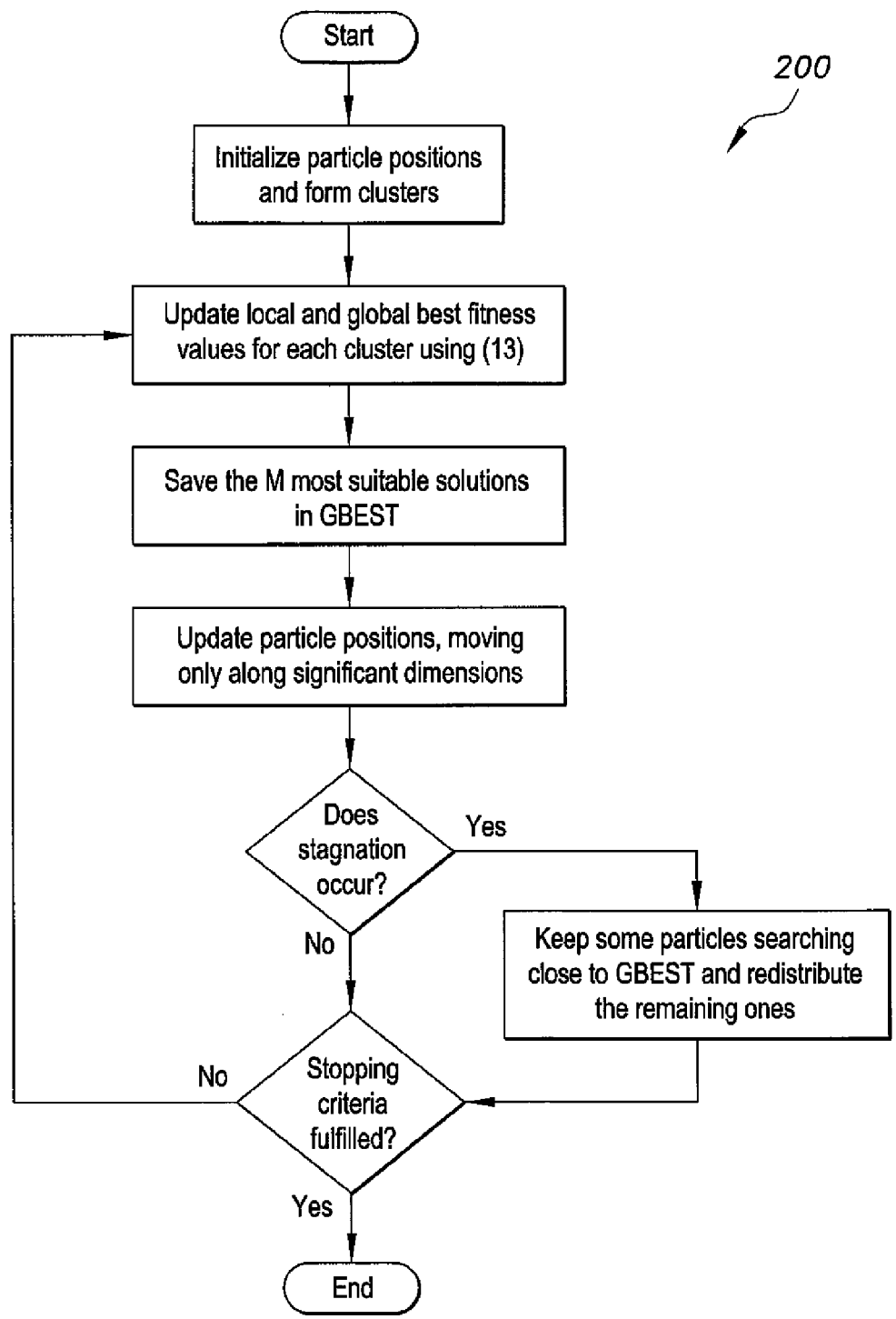
FIG. 2 is a flowchart showing the LP-PSO algorithm according to the present invention.

Similarly, if the particle's position gives a better fit than the actual global best, then the global best at the $n^{th}$ iteration is updated and set to that particle's position. This process is repeated until the PSO reaches or exceeds the performance threshold set in advance or the PSO is run for the maximum number of allowable iterations. FIG. 2 illustrates the general flow of the LP-PSO algorithm.

Figure 3:
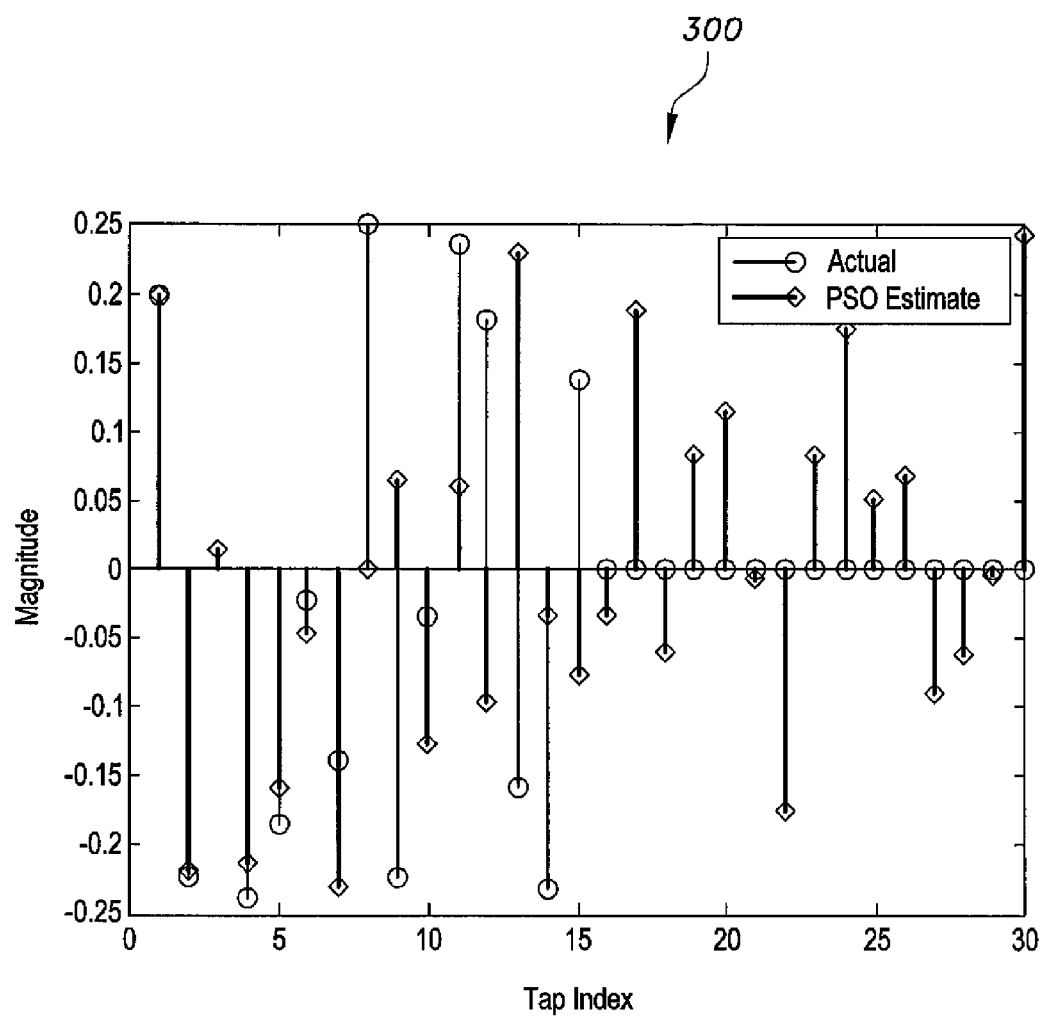
FIG. 3 is a plot showing a PSO estimate of the coefficients of a MP model with an over-sized nonlinearity order.

One issue common to all the available PSO algorithms is that they do not take into account the structure of the parameters' vector to be estimated. For example, if the model is over-sized or has zero-valued taps, the available PSO techniques ignore this structure and try to populate their estimated vector in a way that minimizes the cost function. This means that when PSO is used to estimate an over-sized system, it produces a fully-populated coefficients' vector even if the actual vector has many zeros in it. To better illustrate this, PSO was applied to identify an over-sized memory polynomial model of dimensions L=3 and K=10 while the dimensions of the system to be modeled are L=3 and K=5. Plot 300 of FIG. 3 shows the coefficients obtained using the PSO algorithm as well as the actual coefficients of the model. FIG. 3 clearly illustrates the limitation of the standard PSO algorithm which produces an estimate of the coefficients' vector that has many elements of nonzero magnitude, even though the actual coefficients' vector has zeros in those positions. This arises from the fact that all coefficient taps are uniformly bounded since no prior knowledge of their values is assumed. Thus, the PSO algorithm is effectively forced to scan dimensions which are not relevant, thereby wasting resources and producing an inaccurate estimate in some circumstances.

Moreover, Plot 300 indicates that even if a PSO estimator produces an output signal which is very close to the desired one, the coefficients' vector might be over-populated. This has practical drawbacks since having a larger number of coefficients would require additional computational time and more operations to implement the digital predistortion function. Thus, it is important to have as short a coefficients' vector as possible without compromising its performance, motivating the development of the proposed PSO algorithm.

To overcome the above mentioned limitations of conventional PSO algorithms with application to memory polynomial based digital predistorters, a novel PSO algorithm capable of minimizing the size of an initially over-sized MP based DPD without compromising its performance is proposed. This algorithm is based on making two modifications to conventional PSO algorithms: using a modified clustering-based approach and modifying the cost function used to evaluate the fitness of the particles. In the ensuing, these two aspects are detailed.

In the present PSO algorithm, a cost function based on the zero-norm (here labeled complexity-accuracy tradeoff (CAT) cost function is introduced and combined with a modified cluster-based implementation of PSO. Compared to the standard PSO variant, the cost function used to evaluate the quality of a particle's fitness is modified to reward (or penalize) the particle based on how many non-zero elements it has in its coefficients' vector: The proposed CAT-cost function can be expressed as $$J_i^{CAT}(n) = J_i(n) + \alpha f(\|P_i\|_0) \quad (13)$$

where $J_i(n)$ is as defined in (8), and $\|P_i\|_0$ is the zero-norm of a particle's position vector, defined as:

$$\|P_i\|_0 = \sum_{m=1}^{D} |P_i(m)|^0 \quad (14)$$

where D is the dimension of a particle's position vector. Consequently, it can be seen that the zero-norm essentially counts the number of non-zero elements in $P_i(n)$. Using this feature, the fitness function is now modified through the second term to reward the particles of smaller dimensions using an adjustable 'penalty' factor that is proportional to the number of non-zero (i.e. populated) elements a particle has in its position vector. Accordingly, the proposed cost function modifies the behavior of PSO by making the particles try to find the solution achieving the best tradeoff between accuracy and number of zeros in the coefficients' vector.

The tradeoff between the two requirements of minimizing the NMSE using the shortest possible vector is governed by the parameter $\alpha$. In intuitive terms, one can think of $\alpha$ as an indicator of how much importance one places on the dimension of the coefficients' vector compared to the accuracy of the estimation. α is a regularization parameter used for scaling the zero-norm modifier part of the cost function, this parameter should be selected according to the desired tradeoff between size and accuracy. In this work, a tradeoff of up to 1 dB in the most extreme case (i.e. a model with half the size provides an estimate that is 1 dB less accurate than that of the full model) was considered acceptable, hence the parameter α was set to 0.25.

The minimization of the $l_0$-norm in equation (13) is challenging when attempted using classical optimization techniques, as it represents what is known as a non-polynomial (NP) hard problem. However since PSO techniques are independent of the cost function used, they can be applied to solve this problem. The present method uses a linear function $f(\|P_i\|_0)$ of the following form, $$f(\|P_i\|_0) = 10\log_{10}\left(\frac{\|P_i\|_0}{D}\right) \quad (15)$$

Figure 1E:
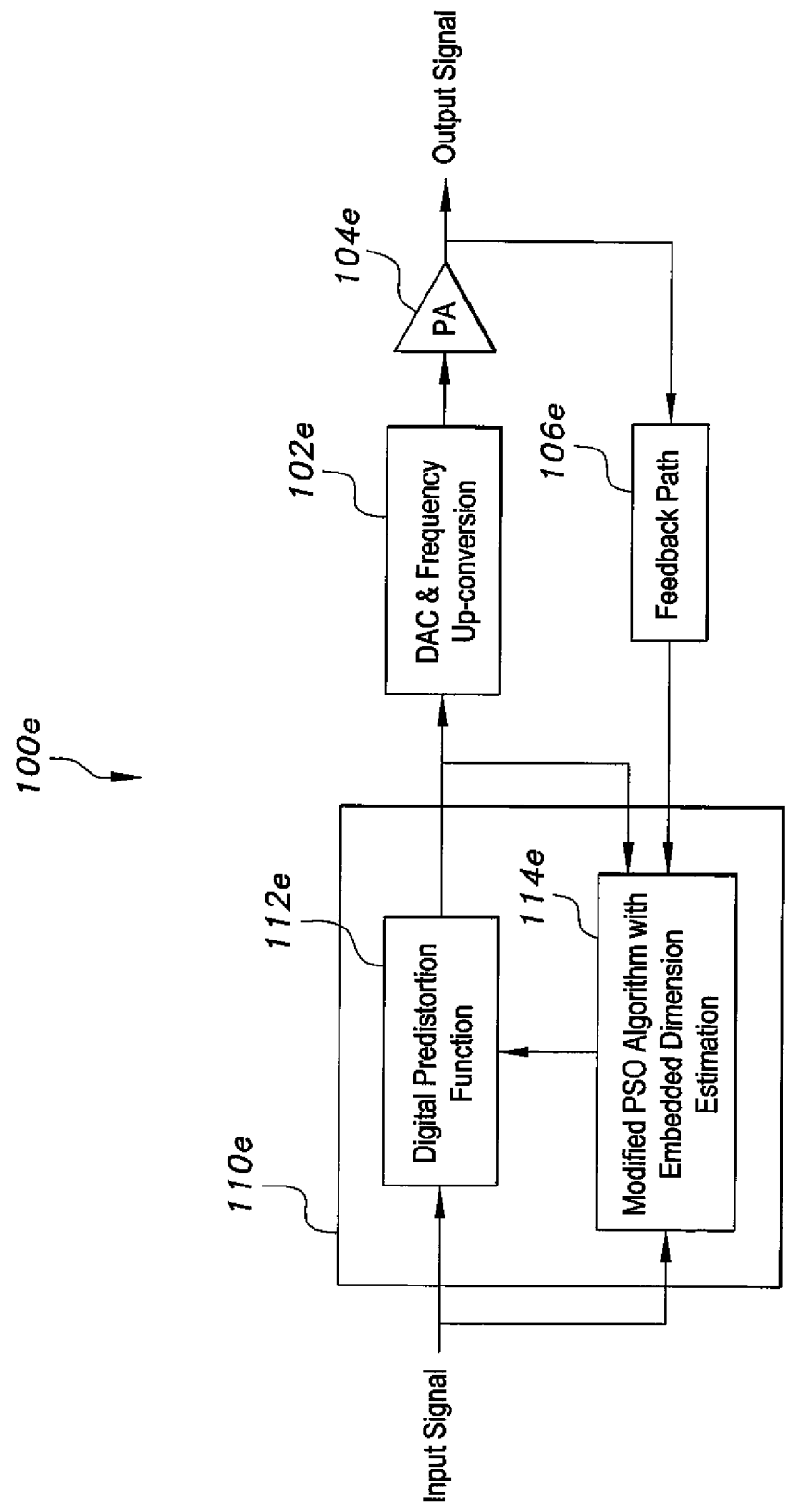
FIG. 1E is a digital predistortion configuration utilized with the modified PSO algorithm with embedded dimension estimation according to the present invention.

In the predistortion system 100e, the cost function in equation (15) is combined with a modified cluster-based PSO algorithm 114e (shown in subsystem 110e of FIG. 1E) to construct a digital predistortion function 112e having the lowest number of parameters without the need to make any prior assumptions. As shown in FIG. 1E, the digital predistorter 110e is made of two blocks: the digital predistortion function 112e and the modified PSO algorithm with embedded dimension estimation 114e. The input signal feeds the digital predistortion function 112e which feeds the digital to analog conversion and frequency up-conversion block 102e. The signal obtained at the output of 102e is applied at the input of the power amplifier 104e. A feedback chain 106e contributes to the feedback path back to the PSO algorithm 114e. The modified PSO algorithm 114e estimates the dimensions of the digital predistortion function and identifies its coefficients. The coefficients vector obtained at the output of the modified PSO-algorithm 114e is then applied to the digital predistortion function 112e. In the literature, cluster-based implementations of PSO have been shown to outperform the traditional PSO algorithms in terms of both estimation accuracy and efficiency, as they require a lower number of particles. Steps of the clustering-based implementation are detailed in Table 1.

TABLE 1

Clustering-based implementation steps

| STEP | Procedure |
|---|---|
| 1 | Partition the swarm into clusters: divide the full swarm into S sub-swarms, or clusters of particles. For each of these sub-swarms, search a specific region of the solution space corresponding to a possible combination of L and K. |
| 2 | Collect multiple candidates solutions: evaluate the fitness of each particle using equation (13), and record the best position of each sub-swarm and the swarm in general. Each best position corresponds to the best CAT-cost function obtained, at time n, for the corresponding pair of L and K. If multiple candidate solutions achieve comparable performance (within 1 or less dB of the best solution), save their respective Gbest vectors (Gbest$_m$) in a matrix denoted by GBEST. This matrix is defined by:<br>GBEST = [Gbest$_1$ ... Gbest$_m$ ... Gbest$_M$] (16)<br>where M ≤ S s is the number of acceptable solutions. |

TABLE 1-continued

Clustering-based implementation steps

| STEP | Procedure |
|---|---|
| 3 | Updating the positions: update the positions of each particle according to equation (9), and each particle then picks from the matrix GBEST the closest Gbest$_m$ to its current position. This automated de-clustering/clustering performed at each iteration ensures that promising clusters remain active, while ones with low performance do not. |
| 4 | Checking for zeros: after updating the position of the particles and finding the new set of candidate solutions, the elements of the position vector of each particle are checked to see if they have been 'off' (i.e. of very low value (typically less than 5% of the maximum tap) ) for more than a certain number of iterations I (set to 2 in this work). If so, then these positions are ignored in subsequent updates by forcing them to zero to avoid the need to search over them. |
| 5 | Checking for stagnation: if the swarm settles on a global best and exhibits stagnation, some particles are retained to search within the vicinity of this solution while the remaining members of the swarm are re-scattered throughout the search space to find a better solution, if one exists. This last step ensures that local minima are avoided and that alternative solutions can be investigated. |

This approach differs from the traditional cluster-based PSO implementation in that the structured clustering is enforced only in the initial phase of the algorithm and afterwards, the swarm is allowed to re-organize itself by having each particle move towards the location of the Gbest closest to it. The steps 200 involved in the implementation of the present $l_0$ NORM PENALIZED PSO (LP-PSO) algorithm are summarized in the flowchart of FIG. 2. The advantage of using a cluster-based approach over a traditional PSO one is that utilizing clusters allows the algorithm to efficiently exclude possible guesses for the model dimensions which are incorrect; as the sub-swarms tasked with searching over that region of the space would perform poorly and be terminated. The lack of this feature in the traditional PSO approach means that the algorithm would continue searching over dimensions which are not relevant, thereby affecting its performance.

Figure 9A:
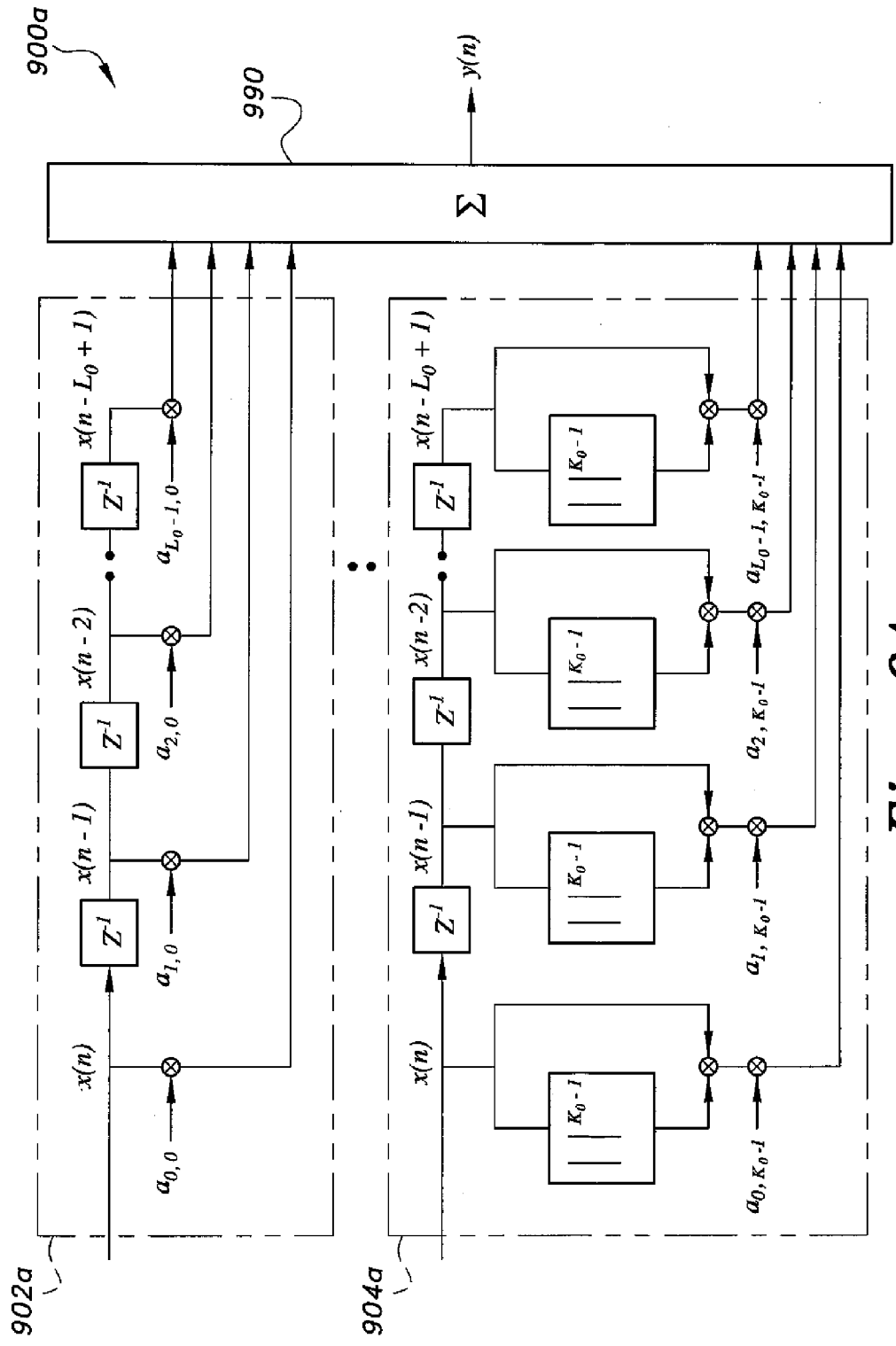
FIG. 9A is a block diagram showing implementation of the PSO DPD for a correctly-sized model according to the present invention.
Figure 9B:
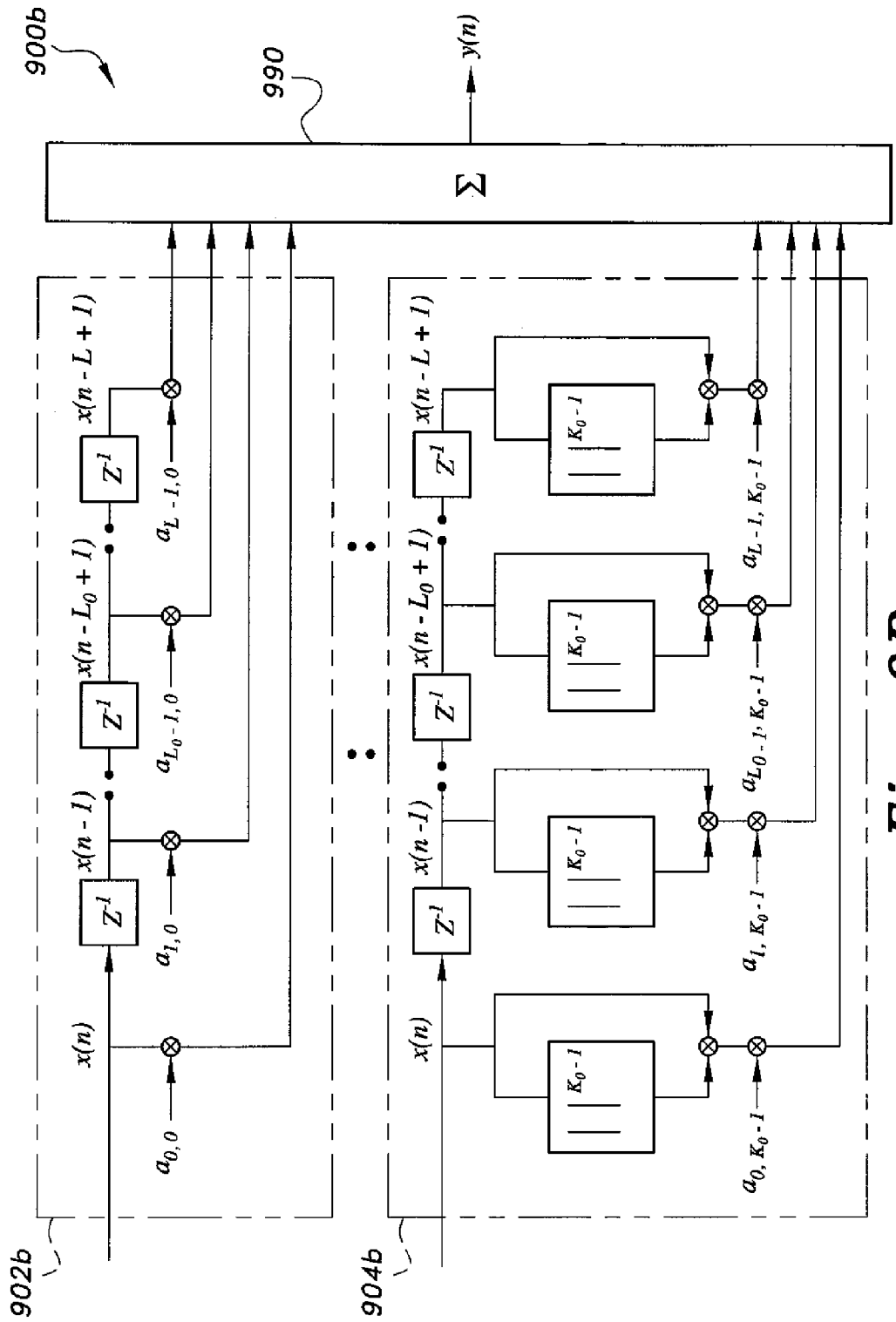
FIG. 9B is a block diagram showing implementation of the PSO DPD for over-sized L according to the present invention.
Figure 10A:
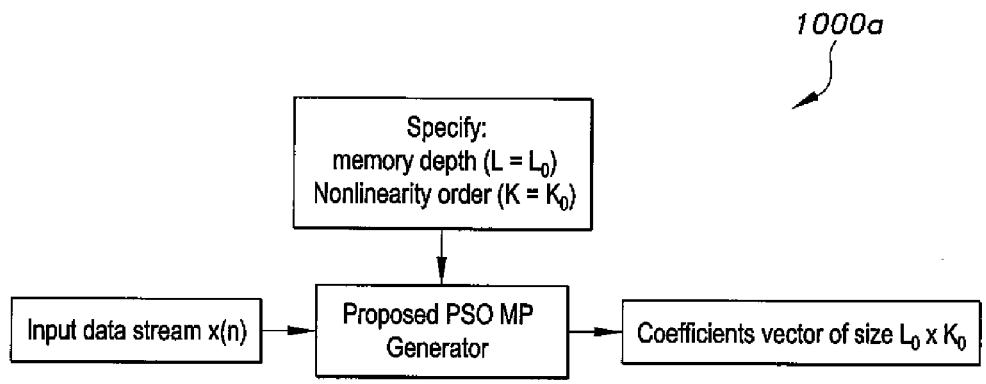
FIG. 10A is a block diagram showing input-processing-output of the proposed PSO DPD for a correctly-sized model according to the present invention.
Figure 10B:
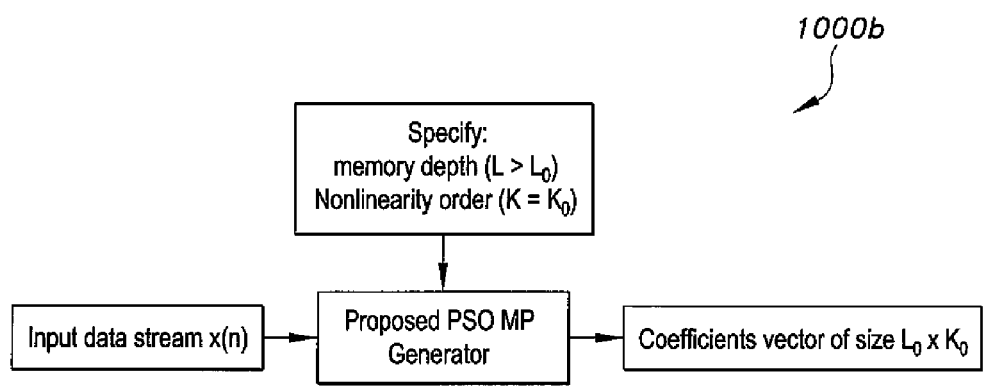
FIG. 10C is a block diagram showing input-processing-output of the proposed PSO DPD for over-sized K according to the present invention.
FIG. 10D is a block diagram showing input-processing-output of the proposed PSO DPD for over-sized L and K according to the present invention.
Figure 10C:
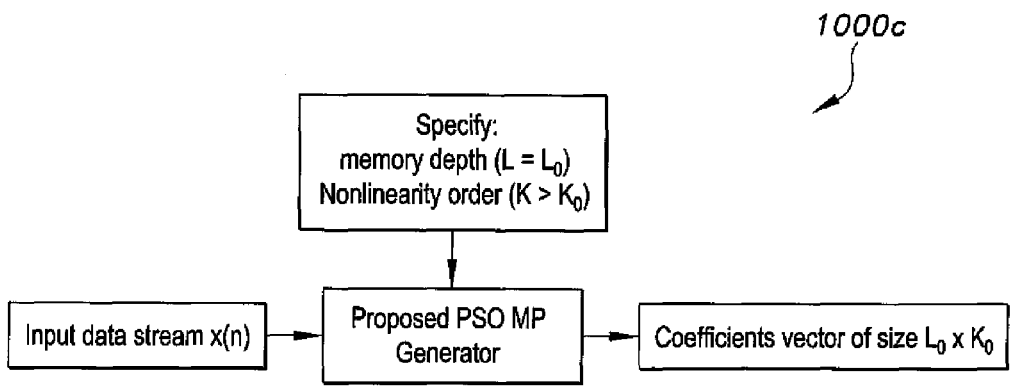
Figure 10D:
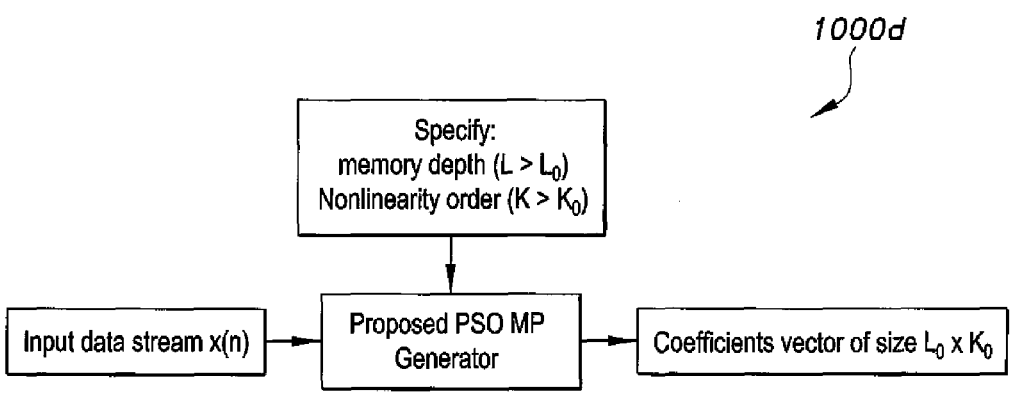

FIGS. 9A through 9D2 are block diagrams showing practical implementations of the present memory polynomial digital predistortion function based on the PSO approach that covers the aforementioned L and K parameter scenarios.

Circuit 900a implements the digital predistortion function 112e for a correctly sized memory polynomial (MP) model. It uses a series of delay cascades 902a accepting an input x(n), where each delayed input signal sample in the cascade is multiplied by a respective a polynomial coefficient (from $a_{0,0}$ up to $a_{L_0-1,0}$) based on the $L_0$ parameters, the cascade products being summed in summer 990. These series of delay lines repeat until coefficients $a_{L,K_0-2}$ have been processed. The last delay cascade 904a, also accepting the same input x(n) as 902a multiplies product terms of the delayed input signal samples with their corresponding magnitudes elevated to the power $K_0-1$. These $L_0-1$ product terms are multiplied with the $a_{L,K_0-1}$ polynomial coefficient for each delay unit, the cascade of multiplied product terms being summed in summer 990 to provide a predistorted output y(n).

Circuit 900b implements the digital predistortion function 112e for a memory polynomial (MP) model having L oversized. It uses a series of delay cascades 902b accepting an input x(n), where each delayed input signal sample in the cascade is multiplied by a respective a polynomial coefficient (from $a_{0,0}$ up to $a_{L-1,0}$) based on the L parameters, the cascade products being summed in summer 990. These series of delay lines repeat until coefficients $a_{L,K_0-2}$ have been processed. The last delay cascade 904b, also accepting same input x(n) as 902b is similar to the last delay cascade 904a except it has additional product terms utilizing coefficients $a_{L_0,K_0-1}$ up to $a_{L-1,K_0-1}$, the cascade of multiplied product terms are summed in summer 990 to provide a predistorted output y(n).

Circuit 900c implements the digital predistortion function 112e for a memory polynomial (MP) model having K oversized. It uses a series of delay cascades 902c accepting an input x(n), where each delayed input signal sample in the cascade is multiplied by a respective a polynomial coefficient (from $a_{0,0}$ up to $a_{L_0-1,0}$) based on the $L_0$ parameters, the cascade products being summed in summer 990. These series of delay lines repeat until coefficients $a_{l,K_0-2}$ have been processed. The $K_0-1$ th series of delay cascades 904c, also accepting the same input x(n) as 902c processes product terms $K_0-1$, and are summed in summer 990. The last series of delay cascades 906c, also accepting the same input x(n) as 902c processes product terms K−1, the cascade of multiplied product terms are summed in summer 990 to provide a predistorted output y(n).

Circuit 900d implements the digital predistortion function 112e for a memory polynomial (MP) model having both L and K over-sized. It uses a series of delay cascades 902d accepting an input x(n), where each delayed input signal samplein the cascade is multiplied by a respective a polynomial coefficient (from $a_{0,0}$ up to $a_{L-1,0}$) based on the L parameters, the cascade products being summed in summer 990. The number of delay units in this series is (L−1). These series of delay lines repeat until coefficients $a_{l,K_0-2}$ have been processed. The $K_0-1$ th series of delay cascades 904d, also accepting the same input x(n) as 902d processes product terms $K_0-1$, and are summed in summer 990. Series 904d repeats until coefficients $a_{l,K-2}$ have been processed. The last delay cascade 906d, also accepting the input x(n) as 902d processes product terms K−1, the a terms ranging from $a_{0,K-1}$ through $a_{L-1,K-1}$, the cascade of multiplied product terms are summed in summer 990 to provide a predistorted output y(n).

Figure 11:
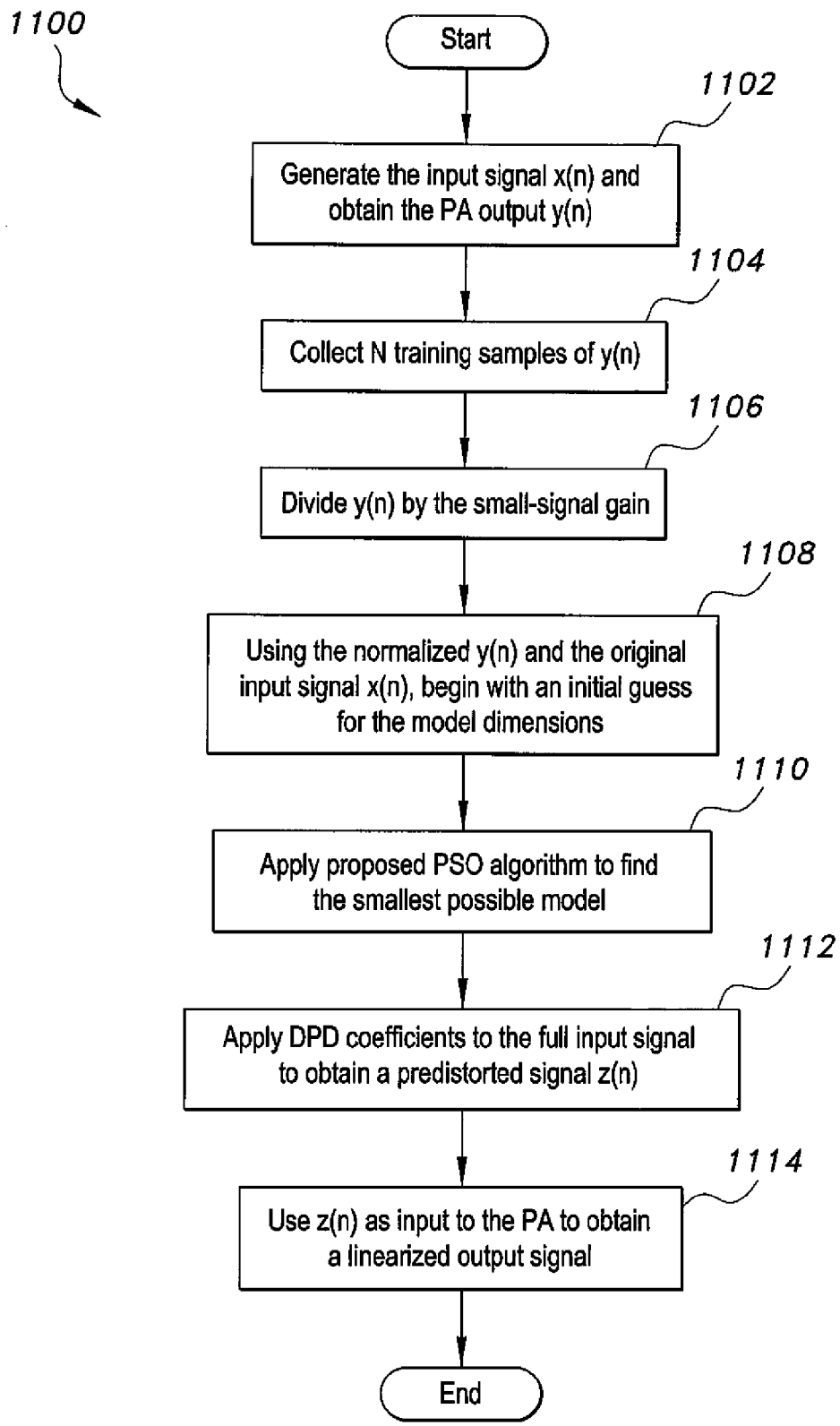
FIG. 11 is a flowchart of the predistortion process using the model size estimation method according to the present invention.

Block diagrams 1000a through 1000d of FIGS. 10A through 10D, respectively recapitulate the input-processing-output stream of the present memory polynomial based digital predistorter utilizing the LP-PSO MP generator. The predistortion method 1100 is summarized in the flowchart shown in FIG. 11. At step 1102, the input signal x(n) is generated and the PA output y(n) is obtained. N training samples of y(n) are collected at step 1104. The output y(n) is divided by the small signal gain at step 1106 to obtain the normalized y(n). At step 1108, using the normalized y(n) and the original input signal x(n) an initial guess for the model dimensions is provided. At step 1110, the LP-PSO algorithm is applied to find the smallest possible model. At step 1112, DPD coefficients are applied to the full input signal to obtain a predistorted signal z(n). At step 1114, z(n) is used as input to the PA to obtain a linearized output signal.

Figure 4:
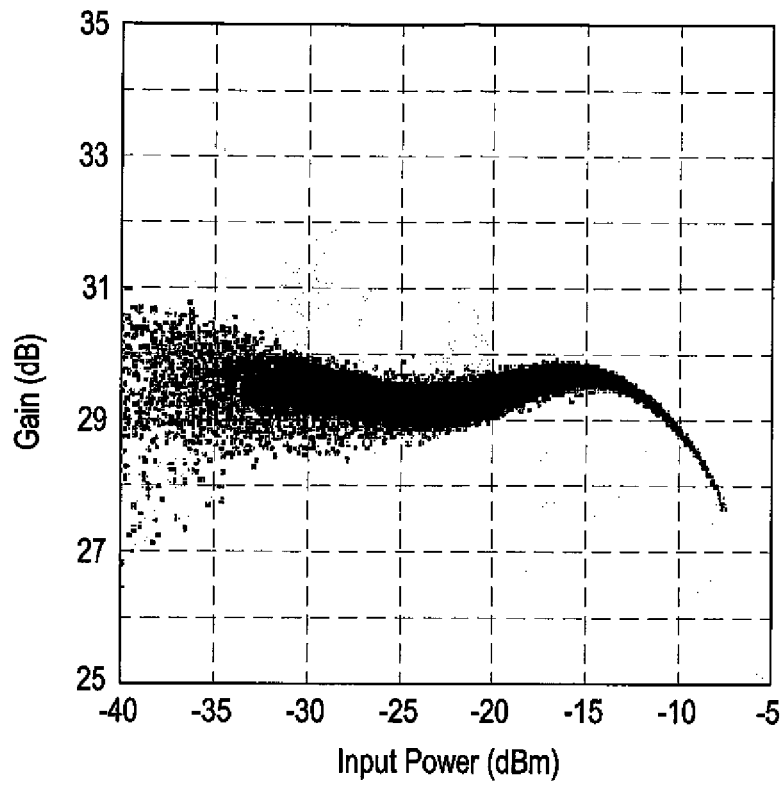
FIG. 4 is a plot showing measured AM/AM characteristic of a DUT.
Figure 5:
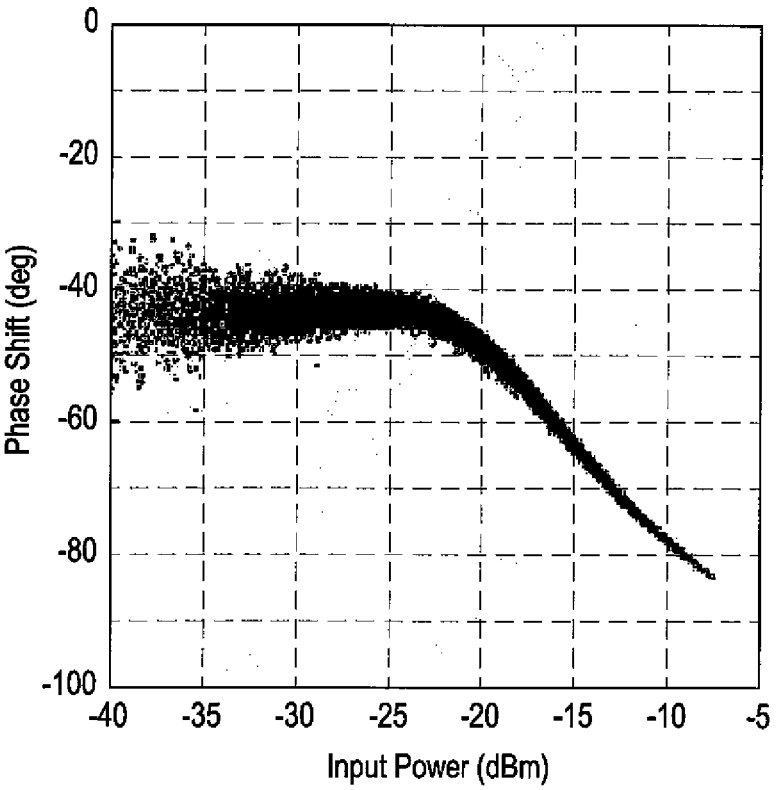
FIG. 5 is a plot showing measured AM/PM characteristic of a DUT.

The device under test (DUT) used for the experimental validation is a symmetrical Doherty PA built using a 10 W packaged Gallium Nitride (GaN) devices (CGH40010 from Cree Inc., Durham, N.C.) in a known configuration with a frequency of operation of 2140 MHz. The test signal used is a 4-carrier WCDMA signal with a total bandwidth of 20 MHz, sampled at 92.6 MHz. The DUT was characterized by measuring its input and output baseband complex waveforms using a known standard experimental setup. The AM/AM and AM/PM characteristics of the DUT are depicted in plots 400 and 500 of FIGS. 4 and 5, respectively. The proposed DPD was implemented using an indirect learning architecture (ILA).

To validate the performance of the present algorithm, the DUT was modeled using the memory polynomial model. The model was found to give its best NMSE value when its dimensions are set to L=3 and K=5, meaning that this is the shortest possible model size giving adequate performance. The predistortion function corresponding to the DUT's measured characteristics was then modeled using over-sized MP functions of varying dimensions to account for the three possible over-sizing scenarios. The coefficients of the over-sized models were subsequently extracted using the present PSO technique. Four identification experiments were conducted to account for the various model over-sizing scenarios. These experiments are listed in Table 2.

TABLE 2

Experiments for the various model scenarios

| Experiment | Case Number |
| --- | --- |
| 1 | Case 1: correctly-sized case with L = 3 and K = 5. |
| 2 | Case 2: over-sized nonlinearity order case with L = 3 and K = 8 |
| 3 | Case 3: over-sized memory depth case with L = 5 and K = 5. |
| 4 | Case 4: simultaneously over-sized nonlinearity order and memory depth case with L = 5 and K = 8. |

Only the oversized cases were considered as they are the ones of practical interest. The above identification experiments were each run independently 100 times on an Intel core i7 CPU, E8400 1.73 GHz computer using MATLAB R2012a (from MathWorks Inc., Natick, Mass.) and the results were averaged. The standard deviation of the NMSE obtained was ranging from 0.68 to 0.88. The PSO parameters used in this study were selected after performing an extensive sensitivity analysis which resulted in the values reported in Table 3.

TABLE 3

Parameters used for the PSO algorithms

| ALGORITHM | SWARM SIZE | NUMBER OF SUB SWARMS | b | c | ω | α | I |
| --- | --- | --- | --- | --- | --- | --- | --- |
| PSO | 200 | N/A | 4 | 4 | 0.8 | N/A | N/A |
| LP-PSO | 200 | 4 | 4 | 4 | 0.7 | 0.25 | 5 |

Table 4 presents a comparison between the results of the conventional PSO algorithm and that of the present LP-PSO algorithm for the four cases mentioned above. The performance metric used is the NSME. Table 4 also reports the total number of nonzero coefficients estimated using the LP-PSO algorithm. These results illustrate the ability of the proposed LP-PSO in outperforming the conventional PSO in terms of accuracy as it can be observed through the NMSE results. Moreover, the LP-PSO algorithm is able to reduce the number of coefficients in an over-sized model. This results in a reduction of the DPD's total number of coefficients ranging from 25% to 40% when compared to the results of the standard PSO algorithm.

TABLE 4

Performance of the Traditional and Present
PSO Algorithms for the Four Experiments

| Algorithm | NMSE (dB) | Total Number of Coefficients |
|---|---|---|
| CASE 1: L = 3, K = 5 | | |
| PSO | −32.60 | 15 |
| LP-PSO | −31.17 | 15 |
| CASE 2: L = 3 K = 8 | | |
| PSO | −25.46 | 24 |
| LP-PSO | −30.41 | 18 |
| CASE 3: L = 5, K = 5 | | |
| PSO | −28.71 | 25 |
| LP-PSO | −29.59 | 17 |
| CASE 4: L = 5 K = 8 | | |
| PSO | −25.44 | 40 |
| LP-PSO | −30.04 | 25 |

Figure 6:
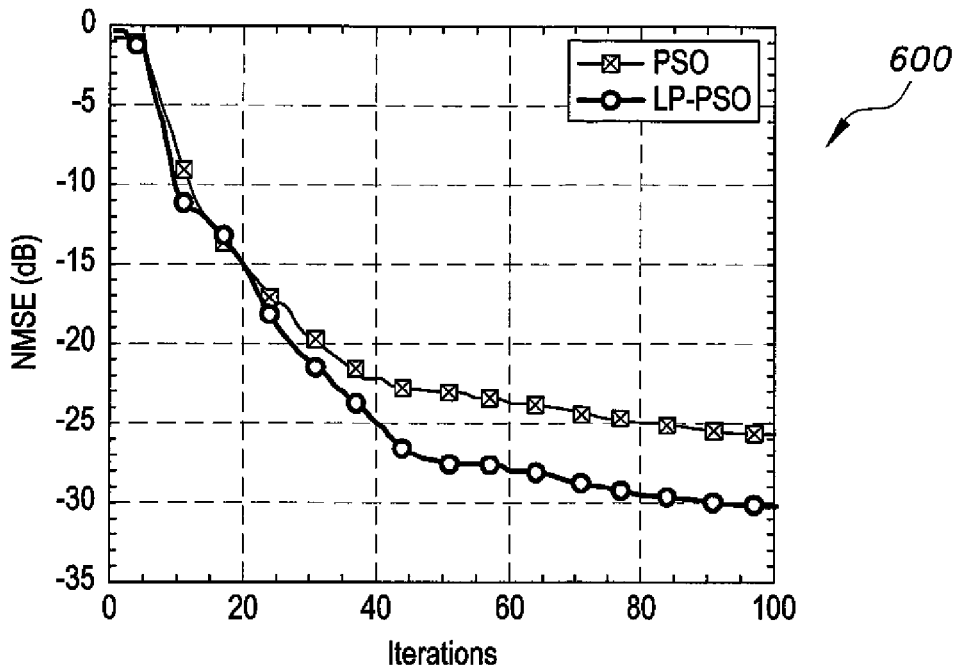
FIG. 6 is a plot showing learning curves of PSO and LP-PSO for L=5 and K=8.

Plot 600 of FIG. 6 shows the learning curves of the PSO and LP-PSO algorithms when estimating the over-sized model of Case 4. This plot shows the advantage held by LP-PSO over PSO in terms of error performance when estimating over-sized models. This advantage can be explained by the fact that the conventional PSO algorithm attempts to estimate a vector of size 40 using the same number of particles, whereas LP-PSO takes advantage of the presence of zeroes in the model and utilizes its resources (i.e. particles) more efficiently.

Figure 7:
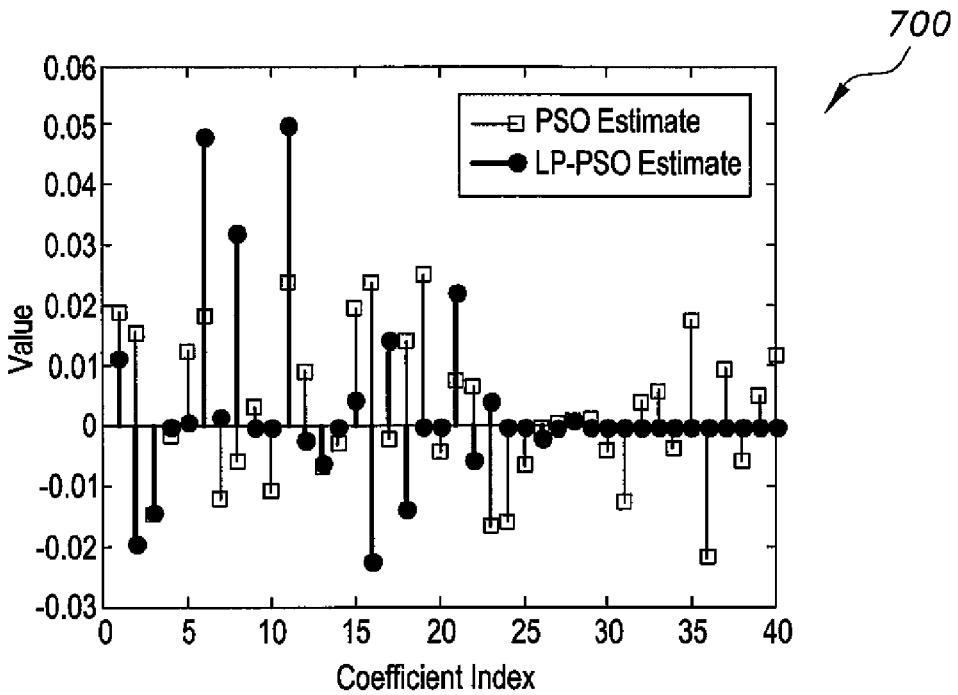
FIG. 7 is a plot showing coefficients' vectors estimated by PSO and LP-PSO algorithms for L=5 and K=8.

The coefficients' vectors estimated in Case 4 by both the PSO and the present LP-PSO algorithms are shown in plot 700 of FIG. 7. From this plot, the advantage of LP-PSO in terms of estimating the true dimensions of a memory polynomial DPD can be seen; with PSO estimating a fully-populated coefficients' vector while LP-PSO produces one that corresponds to a model with only 25 coefficients. Another aspect of the performance of the proposed algorithm which can be inferred from the results is that it performs better when the dimension K is over-sized as opposed to the memory depth L. This can be attributed to the fact that over-sizing K adds L contiguous elements to the coefficient vector. This in turn causes the traditional PSO to suffer in terms of performance as it searches over a uniformly-bounded space and thus has a larger space to search over. Since in practice, K is the parameter most likely to be over-sized, this adds to the value of the proposed algorithm.

Figure 8:
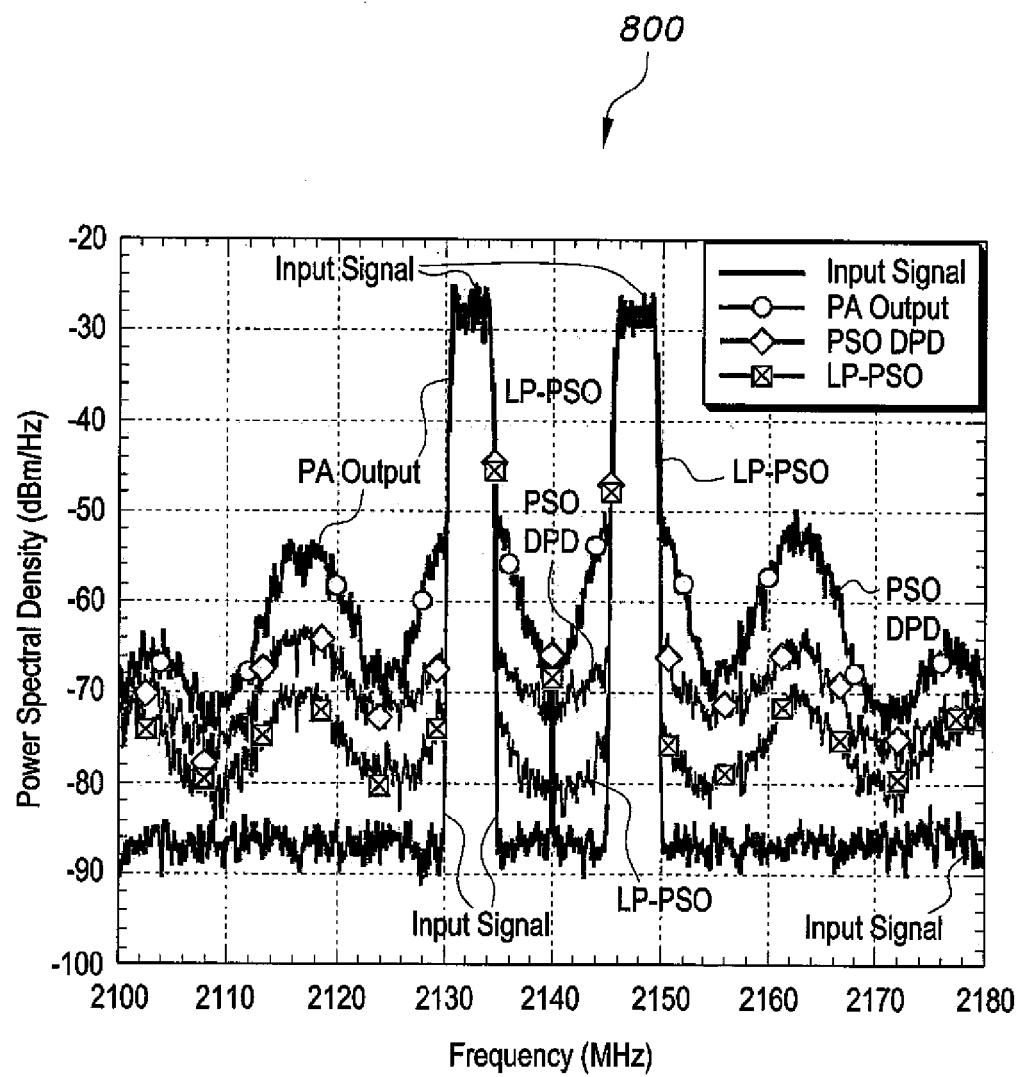
FIG. 8 is a plot showing power spectral density for PSO DPD vs. LP-PSO DPD according to the present invention.

To further benchmark the performances of both algorithms, the spectra obtained at the output of linearized amplifier using the predistorter identified using the conventional PSO algorithm and that identified using the present LP-PSO algorithm are reported in plot 800 of FIG. 8. These two predistorters were derived for Case 4. The frequency domain results corroborate the findings observed in time domain through the NMSE results of Table 4. In fact, the predistorter obtained using the LP-PSO algorithm outperforms that derived using the conventional PSO algorithm while requiring a lesser number of coefficients.

The present memory polynomial predistorter is capable of estimating its dimensions using particle swarm optimization. The present approach was found to achieve good performance in terms of estimation accuracy while having the extra benefit of determining the correct dimensions of the memory polynomial based predistortion function, supporting its value in the area of digital predistortion. The performances of the present LP-PSO based predistorter were benchmarked against those of the regular PSO based predistorter. The results illustrate the ability of the present predistorter to reduce the required number of coefficients without compromising the predistorter's accuracy.

It is to be understood that the present invention is not limited to the embodiments described above, but encompasses any and all embodiments within the scope of the following claims.

We claim:

1. In a memory polynomial (MP) based digital predistorter (DPD) connected to a power amplifier, wherein the power amplifier has a feedback loop for inputting amplifier output parameters to the DPD, an MP based digital predistortion method, comprising the steps of:

estimating an optimally small DPD memory length, L, and an optimally low nonlinearity order, K, wherein said estimating step further comprises the step of executing a $l_0$ norm-penalized particle swarm optimization (LP-PSO) procedure, said LP-PSO procedure including a step for calculating for each particle an objective function characterized by the relation, $$J_i^{CAT}(n) = J_i(n) + \alpha f(\|P_i\|_0)$$

where, $J_i^{CAT}$ is a complexity-accuracy tradeoff (CAT) cost function, $\|P_i\|_0$ is the zero-norm of a particle's position vector, defined as $$\|P_i\|_0 = \sum_{m=1}^{D} |P_i(m)|^0$$

and, $$J_i(n) = 10\log_{10}\left(\frac{1}{N}\sum_{n=1}^{N} \frac{\|e(n)\|^2}{\|d(n)\|^2}\right),$$

where, d(n) is a desired output signal used to evaluate accuracy of the estimation, e(n) is a difference between an estimated output signal and the desired output signal, α is a regularization parameter used for scaling the zero-norm modifier part of the cost function, and N is a number of samples used for a training block of said LP-PSO procedure;

setting said DPD with said optimally small DPD memory length L and said optimally low nonlinearity order K; and wherein said optimally small memory length L and said optimally low nonlinearity order K improves efficiency of the DPD in linearizing an output signal of the power amplifier.

2. The MP based digital predistortion method according to claim 1, further comprising the step of computing the $f(\|P_i\|_0)$ as a calculation characterized by the relation, $$f(\|P_i\|_0) = 10\log_{10}\left(\frac{\|P_i\|_0}{D}\right),$$

where D is the dimension of a particle's position vector.

3. The MP based digital predistortion method according to claim 2, further comprising the steps of:
  partitioning a swarm of the particles into structured clusters such that the clustering is enforced only in an initial phase of the LP-PSO procedure; and afterwards,
  moving each particle towards a location of a global best location (Gbest) closest to it, thereby allowing the swarm to re-organize itself wherein each structured cluster (sub-swarm) searches a specific region of solution space corresponding to a possible combination of L and K.

4. The MP based digital predistortion method according to claim 3, further comprising the steps of:
  evaluating the fitness of each particle using the CAT cost function;
  recording the best position of each sub-swarm and the swami in general;
  saving multiple candidate solutions achieving comparable performance in their respective GBEST vectors (Gbest$_m$) in a matrix denoted by GBEST characterized by the relation, GBEST=[Gbest$_1$ ... Gbest$_m$ ... Gbest$_M$], where M≤S is a number of acceptable solutions;
  updating the positions of each particle according to a recursive equation characterized by the relation, $P_i(n)=P_i(n-1)+V_i(n)$, where the velocity of the i$^{th}$ particle, V$_i$, is determined by, $V_i(n)=\omega(n) \cdot V_i(n-1)+b \cdot (\text{Pbest}_i(n)-P_i(n))+c \cdot (\text{Gbest}(n)-P_i(n))$, where $\omega(n)$ is an inertial weight, b is a cognitive coefficient, and c is a social acceleration constant;
  for each particle, picking from the matrix GBEST the closest Gbest$_m$ to its current position, whereby automated de-clustering/clustering performed at each iteration ensures that promising clusters remain active, while ones with low performance do not;
  ignoring very low value particles thereby avoiding the need to search over them; and
  avoiding local minima thereby enabling a search for alternative solutions.

5. A computer software product, comprising a non-transitory medium readable by a processor, the non-transitory medium having stored thereon a set of instructions for establishing a memory polynomial (MP) based digital predistorter (DPD) system based on an optimally small DPD memory length, L, and an optimally low nonlinearity order, K, the set of instructions including:
  (a) a first sequence of instructions which, when executed by the processor, causes said processor to estimate an optimally small DPD memory length L and an optimally low nonlinearity order K wherein said estimating step further comprises the step of executing a $l_0$ norm-penalized particle swarm optimization (LP-PSO) procedure, said LP-PSO procedure including a step for calculating for each particle an objective function characterized by the relation, $J_i^{CAT}(n)=J_i(n)+\alpha f(\|P_i\|_0)$ where, $J_i^{CAT}$ is a complexity-accuracy tradeoff (CAT) cost function, $\|P_i\|_0$ is the zero-norm of a particle's position vector, defined as $$\|P_i\|_0 = \sum_{m=1}^{D} |P_i(m)|^0$$

and, $$J_i(n) = 10\log_{10}\left(\frac{1}{N}\sum_{n=1}^{N} \frac{\|e(n)\|^2}{\|d(n)\|^2}\right),$$

where, d(n) is a desired output signal used to evaluate accuracy of the estimation, e(n) is a difference between an estimated output signal and the desired output signal, $\alpha$ is a regularization parameter used for scaling the zero-norm modifier part of the cost function, and N is a number of samples used for a training block of said LP-PSO procedure;
  (b) a second sequence of instructions which, when executed by the processor, causes said processor to set said DPD with said optimally small DPD memory length L and said optimally low nonlinearity order K; and
  wherein said optimally small memory length L and said optimally low nonlinearity order K improves efficiency of the DPD in linearizing an output signal of the power amplifier.

6. The computer software product according to claim 5, further comprising a third sequence of instructions which, when executed by the processor, causes said processor to perform a calculation of the $f(\|P_i\|_0)$, said calculation being characterized by the relation, $$f(\|P_i\|_0) = 10\log_{10}\left(\frac{\|P_i\|_0}{D}\right),$$

where D is the dimension of a particle's position vector.

7. The computer software product according to claim 6, further comprising:
  a fourth sequence of instructions which, when executed by the processor, causes said processor to partition a swarm of the particles into structured clusters such that the clustering is enforced only in an initial phase of the LP-PSO procedure; and afterwards,
  a fifth sequence of instructions which, when executed by the processor, causes said processor to cause each particle to move towards a location of a global best location (Gbest) closest to it, thereby allowing the swarm to re-organize itself wherein each structured cluster (sub-swarm) searches a specific region of solution space corresponding to a possible combination of L and K.

8. The computer software product according to claim 7, further comprising:
  a sixth sequence of instructions which, when executed by the processor, causes said processor to evaluate the fitness of each particle using the CAT cost function;
  a seventh sequence of instructions which, when executed by the processor, causes said processor to record the best position of each sub-swarm and the swarm in general;
  an eighth sequence of instructions which, when executed by the processor, causes said processor to save multiple candidate solutions achieving comparable performance in their respective GBEST vectors ($Gbest_m$) in a matrix denoted by GBEST characterized by the relation, $$GBEST=[Gbest_1 \ldots Gbest_m \ldots Gbest_M],$$

where $M \leq S$ is a number of acceptable solutions;
a ninth sequence of instructions which, when executed by the processor, causes said processor to update the positions of each particle according to a recursive equation characterized by the relation, $$P_i(n)=P_i(n-1)+V_i(n),$$

where the velocity of the $i^{th}$ particle, $V_i$, is determined by, $$V_i(n)=\omega(n) \cdot V_i(n-1)+b \cdot (Pbest_i(n)-P_i(n))+c \cdot (Gbest(n)-P_i(n)),$$

where $\omega(n)$ is an inertial weight, b is a cognitive coefficient, and c is a social acceleration constant;
a tenth sequence of instructions which, when executed by the processor, causes said processor to (for each particle) pick from the matrix GBEST the closest $Gbest_m$ to its current position, whereby automated de-clustering/clustering performed at each iteration ensures that promising clusters remain active, while ones with low performance do not;
an eleventh sequence of instructions which, when executed by the processor, causes said processor to ignore very low value particles thereby avoiding the need to search over them; and
a twelfth sequence of instructions which, when executed by the processor, causes said processor to avoid local minima thereby enabling a search for alternative solutions.

\* \* \* \* \*